(12) United States Patent
Xu et al.

(10) Patent No.: US 9,397,680 B2
(45) Date of Patent: Jul. 19, 2016

(54) RECEIVER WITH ADJUSTABLE REFERENCE VOLTAGES

(71) Applicant: eTopus Technology Inc., Sunnyvale, CA (US)

(72) Inventors: Danfeng Xu, Cupertino, CA (US); Kai Keung Chan, Fremont, CA (US); Yu Kou, San Jose, CA (US)

(73) Assignee: eTopus Technology Inc., Sunnyvale, CA (US)

( * ) Notice: Subject to any disclaimer, the term of this patent is extended or adjusted under 35 U.S.C. 154(b) by 0 days.

(21) Appl. No.: 14/530,224

(22) Filed: Oct. 31, 2014

(65) Prior Publication Data
US 2016/0126970 A1    May 5, 2016

(51) Int. Cl.
*H03M 1/06* (2006.01)
*H03M 1/10* (2006.01)
*H03M 1/12* (2006.01)
*H03M 1/36* (2006.01)

(52) U.S. Cl.
CPC .......... *H03M 1/1023* (2013.01); *H03M 1/1245* (2013.01); *H03M 1/36* (2013.01)

(58) Field of Classification Search
CPC ......................... H03M 1/1023; H03M 1/1245
USPC .................................. 341/118, 120, 155, 144
See application file for complete search history.

(56) References Cited

U.S. PATENT DOCUMENTS 7,688,237 B2 * 3/2010 Cao ..................... H03M 1/1061
                                                          341/120
7,852,253 B2 * 12/2010 Bien .................... H03M 1/0604
                                                          341/143
8,111,178 B2 * 2/2012 Liao .................... H03M 1/1047
                                                          341/120
8,349,919 B2 * 1/2013 Breen ................ A01G 13/0262
                                                          239/1

OTHER PUBLICATIONS

Chen, E-H. et al., "Power Optimized ADC-Based Serial Link Receiver," IEEE Journal of Solid-State Circuits, Apr. 2012, pp. 938-951, vol. 47, No. 4.
Parhi, K.K., "Design of Multigigabit Multiplexer-Loop-Based Decision Feedback Equalizers," IEEE Transactions on Very Large Scale Integration (VLSI) Systems, Apr. 2005, pp. 489-493, vol. 13, No. 4.
Cao, J. et al., "A 500 mW ADC-Based CMOS AFE with Digital Calibration for 10 Gb/s Serial Links Over KR-Backplane and Multimode Fiber," IEEE Journal of Solid-State Circuits, Jun. 2010, pp. 1172-1185. vol. 45, No. 6.
Takemoto, T. et al., "100-Gbps CMOS Transceiver for Multilane Optical Backplane Systems with 1.3 cm² Footprint," Optics Express, Dec. 12, 2011, pp. B777-B783, vol. 19, No. 26.

* cited by examiner

*Primary Examiner* — Peguy Jean Pierre
(74) *Attorney, Agent, or Firm* — Fenwick & West LLP

(57) ABSTRACT

A receiver having an analog to digital converter with adjustable reference voltages that are calibrated to account for process variations. The receiver comprises an analog to digital converter. The analog to digital converter includes a reference generator to generate a set of N reference voltages. The reference generator adjusts voltage levels of the set of N reference voltages based on one or more control signals. A plurality of comparators compare an input signal to the set of N reference voltages. A calibration circuit generates the one or more control signals for adjusting the voltage levels of the N reference voltages based on outputs of the comparators.

17 Claims, 9 Drawing Sheets

RECEIVER WITH ADJUSTABLE REFERENCE VOLTAGES

BACKGROUND

1. Field of the Disclosure

The present disclosure relates to a receiver and, more specifically, to a receiver having an analog to digital converter with adjustable reference voltages.

2. Description of the Related Art

High speed communication systems transfer data over communication links at high data rate. The devices that communicate over these links can include analog to digital converters to convert analog signals into digital form for digital signal processing. However, high speed analog to digital converters are sensitive to process variations that can occur during manufacturing of the devices.

SUMMARY

Embodiments of the present disclosure include a receiver having an analog to digital converter with adjustable reference voltages that are calibrated to account for process variations and gain mismatch between different ADCs. In one embodiment, a receiver comprises a first analog to digital converter. The first analog to digital converter includes a first reference generator to generate a first set of N reference voltages, the first reference generator adjusting voltage levels of the first set of N reference voltages based on one or more first control signals. The first analog to digital converter also includes a first plurality of comparators to compare a first input signal to the first set of N reference voltages. Calibration circuitry generates the one or more first control signals for adjusting the voltage levels of the first N reference voltages based on outputs of the first plurality of comparators.

In another embodiment, the receiver further comprises a second analog to digital converter. The second analog to digital converter includes a second reference generator to generate a second set of N reference voltages, the second reference generator adjusting voltage levels of the second set of N reference voltages based on one or more second control signals. A second plurality of comparators compare a second input signal to the second set of N reference voltages. The calibration circuitry generates the one or more second control signals for adjusting the voltage levels of the second set of N reference voltages based on outputs of the second plurality of comparators.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments of the present disclosure can be readily understood by considering the following detailed description in conjunction with the accompanying drawings.

DETAILED DESCRIPTION OF EMBODIMENTS

The Figures (FIG.) and the following description relate to preferred embodiments of the present disclosure by way of illustration only. Reference will now be made in detail to several embodiments of the present disclosure, examples of which are illustrated in the accompanying figures. It is noted that wherever practicable similar or like reference numbers may be used in the figures and may indicate similar or like functionality. One skilled in the art will readily recognize from the following description that alternative embodiments of the structures and methods illustrated herein may be employed without departing from the principles of the disclosure described herein.

Embodiments of the present disclosure include a receiver having one or more analog to digital converters with adjustable reference voltages. The adjustable reference voltages can be adjusted during a dedicated calibration mode to account for process variations. In one embodiment, the analog to digital converter may have comparators with unwanted input offsets. These input offsets are accounted for by adjusting the reference voltages until the offsets are cancelled. In another embodiment, different analog to digital converters may have input buffers with different gains. The gain differences can be accounted for by adjusting the reference voltages until the gain differences are cancelled.

Offset Calibration

Figure 1:
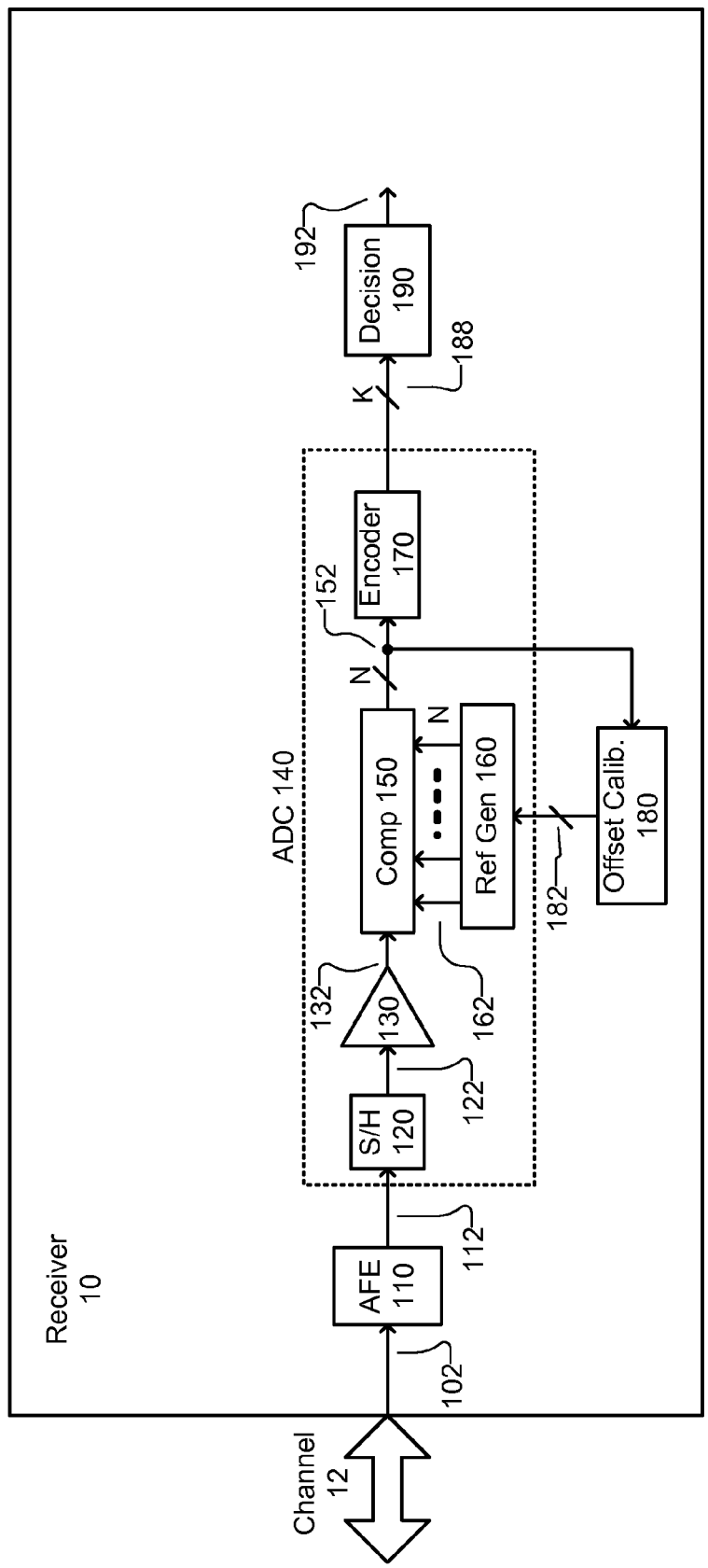
FIG. 1 is a high speed communication system that includes a receiver, according to an embodiment.

FIG. 1 is a high speed communication system that includes a receiver 10, according to an embodiment. The receiver 10 is coupled to a communications channel 12 and receives an analog channel signal 102 from a remote transmitter (not shown) through the communications channel 12. The communications channel 12 can be, for example, a copper communication channel found in a computing backplane that carries single ended or differential signals. The communications channel 12 can also be, for example, an optical communication channel that carries optical signals.

The channel signal 102 is generated at the transmitter from digital data. The receiver 10 recovers digital data 192 from the channel signal 161. In some embodiments the receiver 10 may be a part of a larger device, such as an application specific integrated circuit (ASIC). The receiver 10 includes an analog front end (AFE) 110, an analog to digital converter (ADC) 140, ADC offset calibration circuit 180, and decision circuit 190. In one embodiment, each of these components can be implemented with hardware circuits.

The AFE 110 performs pre-processing on channel signal 102 using analog processing techniques to generate an analog input signal 112. The channel signal 102 may be non-ideal due to channel impairments, such as insertion loss, crosstalk, inter-symbol interference and optical dispersion, and the AFE 110 uses analog processing to reduce some of these non-idealities. Examples of analog processing techniques include gain adjustment, continuous time equalization filter, or analog finite impulse response equalization. In other embodiments the AFE 110 may simply be an input terminal that receives the channel signal 102 and passes it on to generate the analog input signal with no signal processing ADC 140 converts analog input signal 112 into a series of k bit digital input codes 188 by sampling the analog input signal 112 and then rounding or quantizing the sampled input signal to its closest digital value. ADC 140 includes a sample and hold circuit 120, an input buffer 130, a comparator array 150, a reference generator 160 and an encoder 170.

Sample and hold circuit 120 periodically samples the voltage level of the analog input signal 112 and generates a sampled input signal 122 as a result of the sampling. Sample and hold circuit 120 may be implemented by a switch connected to a capacitor. When the switch is closed, the capacitor is charged to the voltage level of the input signal 112. When the switch is opened, the capacitor holds the voltage level that it is charged to. The sampled input signal 122 is then buffered by the buffer 130 into a buffered input signal 132.

The reference generator 160 generates a set of N output reference voltages 162. The comparator array 150 includes N comparators that perform analog to digital conversion by comparing buffered input signal 132 to the N output reference voltages 160. The output of the comparator array 150 is an N bit digital thermometer code. For example, voltage levels of the buffered input signal 132 may be converted into 4 bit thermometer codes as follows:

0V to 0.1 V→0000
0.1V to 0.2V→0001
0.2V to 0.3V→0011
0.3V to 0.4V→0111
0.4V to 0.5V→1111

The encoder 170 then uses thermometer-to-binary encoding to convert the N bit thermometer code 152 into a K bit digital code 188 in binary form.

The decision circuit 190 receives the digital input codes 188 and makes a decision on the logical value represented by the digital input codes 188, thereby recovering digital data 190. The digital data 190 can be multi-bit (e.g. PAM-4) or single-bit data (e.g., NRZ). In one embodiment, decision circuit can compare the digital input code 188 to a threshold code. In one embodiment, decision circuit 190 is a digital signal processor (DSP) that recovers digital data 192 from the digital input codes 188 using digital signal processing algorithms. Examples of decision circuit 190 include adaptive equalizers, decision feedback equalizers (DFE), a finite impulse response (FIR) filter and a maximum likelihood sequence detector (MLSD) (e.g., a Viterbi decoder).

The receiver 10 also includes ADC offset calibration circuit 180 that forms part of a feedback loop for calibrating the output reference voltages 162 based on the output of the comparator array 150. During an ADC offset calibration mode, the ADC offset calibration circuit 180 receives thermometer code 152 and analyzes the thermometer code 152 to generate one or more offset control signals 182. The offset control signals 182 cause the reference generator 160 to adjust the voltage levels of the output reference voltages 162, which in turn compensates for undesired voltage offsets within the comparator array 150. In some embodiments, the offset calibration circuit 180 may use the digital input code 188 as feedback instead of the thermometer code 152 in generating the offset control signals 182. The detailed operation of the ADC 140 and ADC offset calibration circuit 180 will now be explained in greater detail by reference to FIG. 2.

Figure 2:
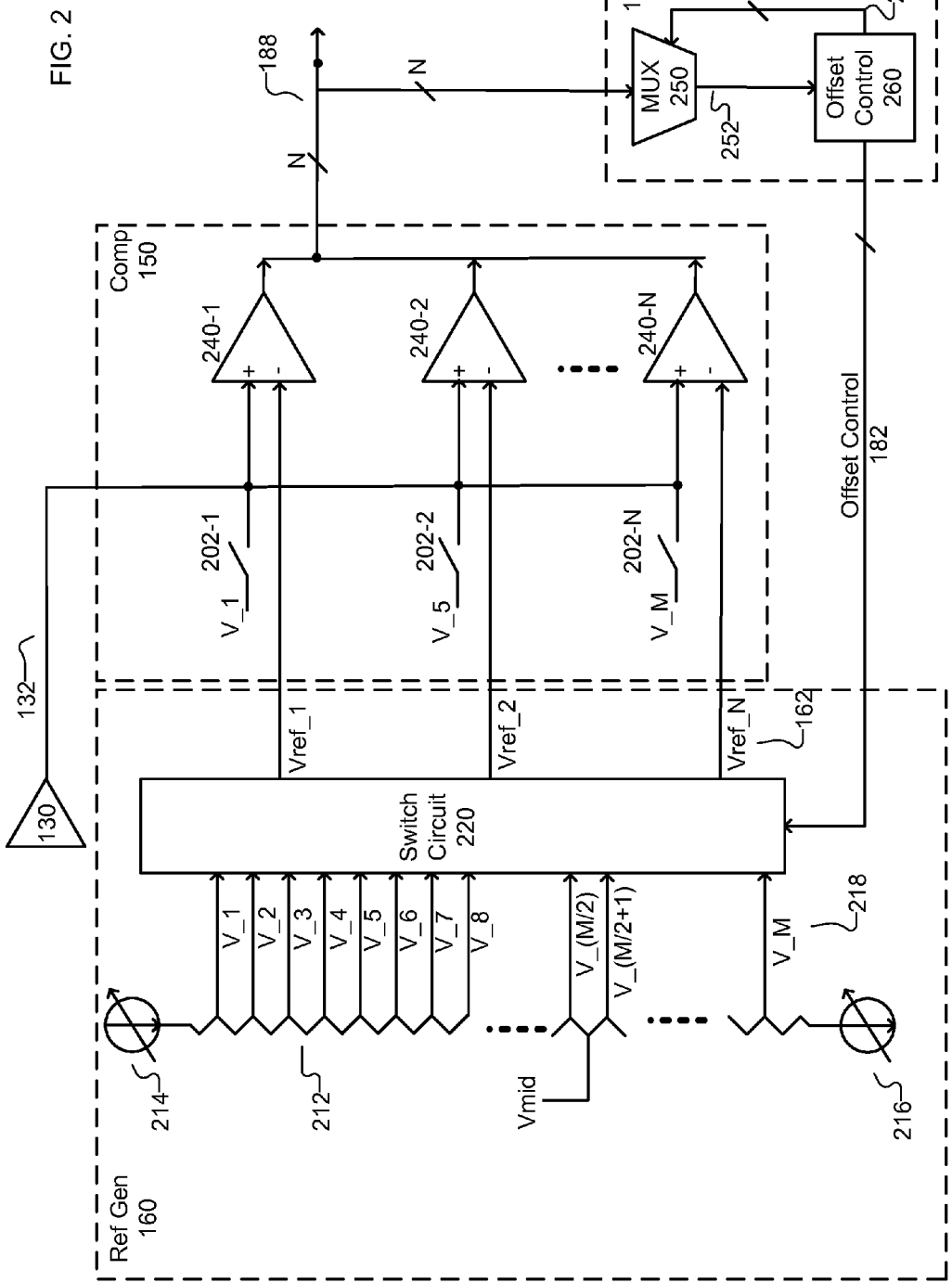
FIG. 2 is a detailed view of a comparator array and reference generator from FIG. 1, according to an embodiment.

FIG. 2 is a detailed view of a comparator array 150, reference generator 160 and offset calibration circuit 180 from FIG. 1, according to an embodiment.

Reference generator 160 includes a resistor string 212, a current source 214, a current sink 216, and a switching circuit 220. Resistor string 212 generates a set of M base reference voltages 218. A midpoint of the resistor string 212 is connected to a voltage source Vmid. Resistor string 212 is also connected between the current source 214 and the current sink 216. Current source 214 and current sink 216 may be referred to herein as current regulators. Current source 214 regulates current flowing through the top half of the resistor string 212 between the current source 214 and the supply voltage Vmid. Current sink 216 regulates current flowing through the bottom half of the resistor string 212 between the supply voltage Vmid and the current sink 216. The current flowing through the resistor string 212 generates the M base reference voltages 218 at different tap points in the resistor string 212. Each base reference voltage 218 has a different voltage level than the next base reference voltage 218.

Figure 3:
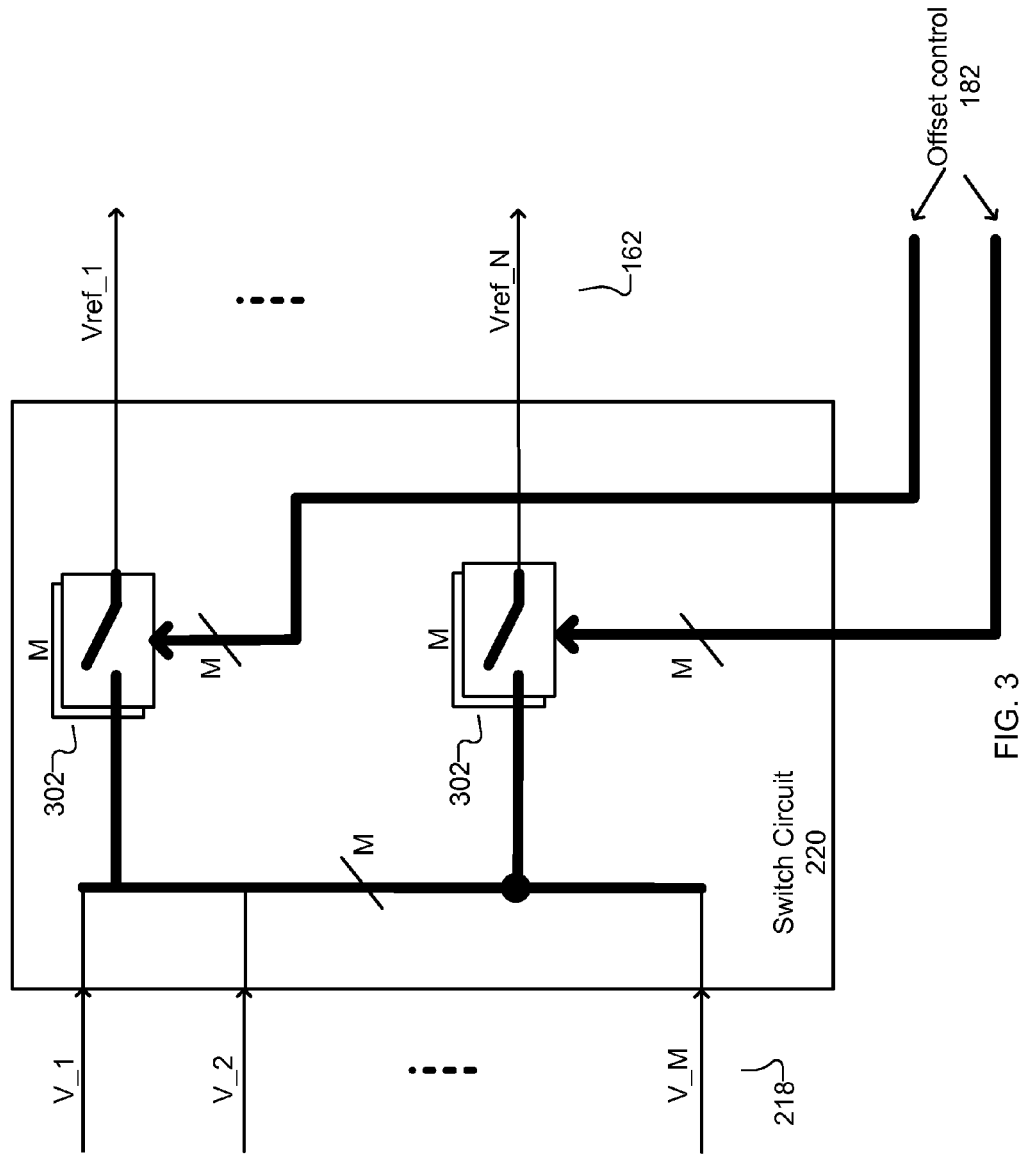
FIG. 3 is a detailed view of a switching circuit from FIG. 2, according to an embodiment.

Switching circuit 220 selectively connects any base reference voltage 218 to any output reference voltage 162. Referring briefly to FIG. 3, illustrated is a detailed view of a switching circuit 220 from FIG. 2, according to an embodiment. The switching circuit 220 includes many transistor switches 302 connected between the base reference voltages 218 and the output reference voltages 162. Each output reference voltage 162 is connected to the base reference voltages 218 through a group of M switches 302. The switches 302 can be selectively opened or closed by the offset control signals 182, which allows any output reference voltage 162 to be generated from any base reference voltage 218. There are M possible settings for each group of M offset control signals 182. There may be a large number of base reference voltages 212 (e.g., M=256) and a smaller number of output reference voltages 162 (e.g., N=64) so that the voltage levels of the output reference voltages 162 can be precisely tuned.

Referring back to FIG. 2, comparator array 150 includes N comparators 240 and calibration switches 202. During regular operational mode, calibration switches 202 are open and buffered input signal 132 is provided to the positive input of each comparator 240. Each comparator 240 compares the buffered input signal 132 to a respective output reference voltage 162. The output of each comparator 240 is a logical 1 or a logical 0 depending on whether the buffered input signal 132 exceeds its respective output reference voltage 162. The outputs of the comparators 240 collectively form a thermometer code 188 that is a digitally converted version of the buffered input signal 132 at a given point in time.

Each comparator 240 may have an inherent offset between its positive and negative inputs due to manufacturing variations between comparators 240. For example, an ideal comparator switches its output between a logical 0 and a logical 1 when both its positive and negative inputs are the same voltage. However, a real comparator 240 will have an inherent voltage offset between its inputs. The voltage offset causes the comparator output to switch between a logical 0 and a logical 1 when there is a small voltage difference (e.g., 20 mV) between its positive and negative inputs. To account for this voltage offset, the ADC offset calibration circuit 180 adjusts the output reference voltages 162, via the offset control signals 182, to negate the voltage offset during an ADC offset calibration mode of operation.

The ADC offset calibration circuit 180 includes a multiplexer 250 and a control circuit 260. The multiplexer 250 selects a single comparator output to pass on to its output 252. The selection of the single comparator output is controlled by multiplexer selection signals 264. The control circuit 260 selects a single comparator output through the multiplexer selection signals 264. The control circuit 260 may also generate switch control signals (not shown) that selectively close switches 202 during ADC offset calibration mode. The control circuit 260 also generates offset control signals 182 that are used to adjust the voltage levels of the output reference voltages 162 by controlling connections between the base reference voltages 218 and the output reference voltage 162.

Figure 2A:
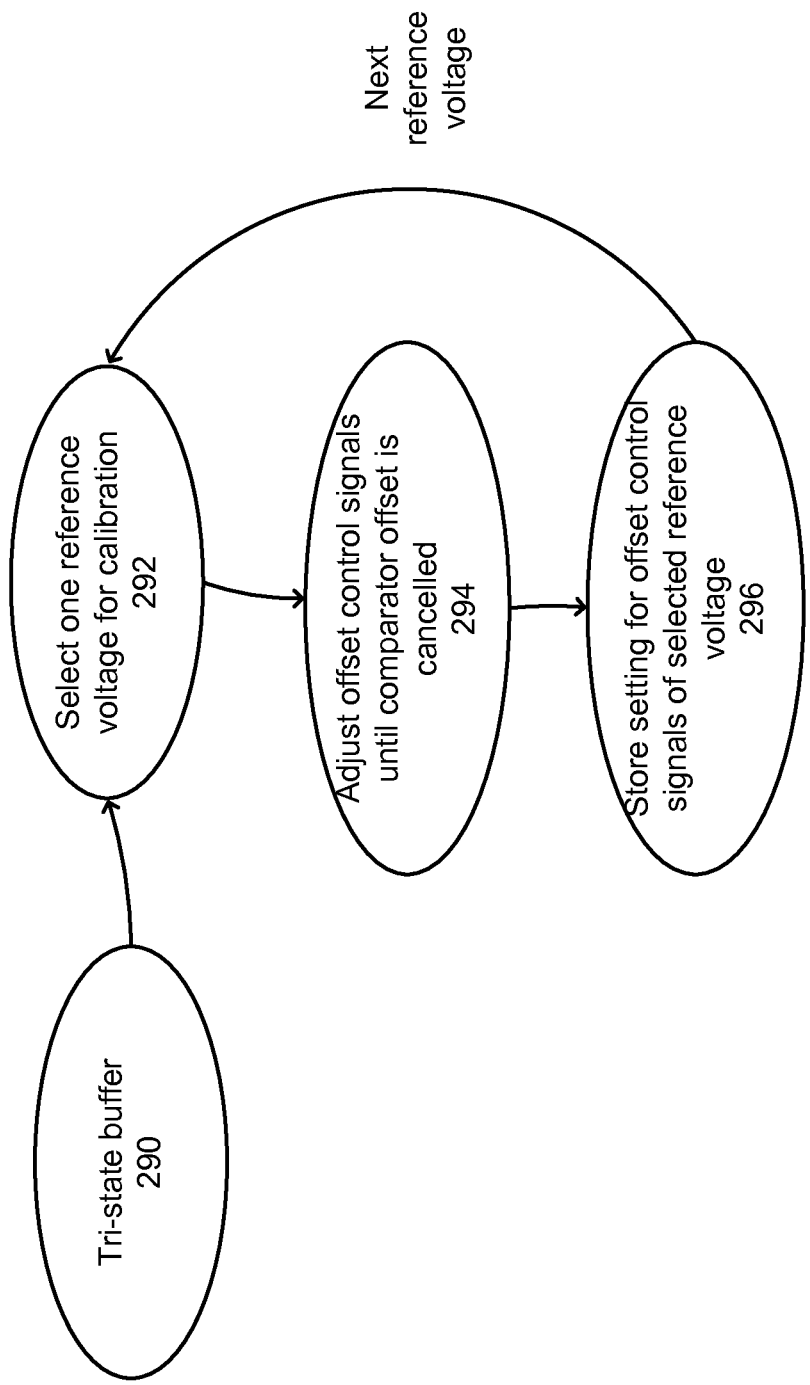
FIG. 2A is a state diagram illustrating the operation of the control circuit of the ADC offset calibration circuit, according to an embodiment.

FIG. 2A is a state diagram illustrating the operation of the control circuit 260 during ADC offset calibration mode, according to an embodiment. In one embodiment, the control circuit 260 is a finite state machine that cycles through states as shown in FIG. 2A. In state 290, the control circuit 260 first tri-states the output of buffer 130. The remaining states 292-296 generally calibrate the output reference voltages 162 one at a time through an iterative feedback process.

In state 292, the control circuit 260 selects one output reference voltage 162 and corresponding comparator 240 for calibration. For example, suppose Vref_2 and comparator 240-2 are selected for calibration. Switch 202-2 would be closed to connect base reference voltage V_5 to the positive input of comparator 240-2. Base reference voltage V_5 represents the ideal target voltage level at which the output of the comparator 240-2 should switch states.

In state 294, control circuit 260 adjusts the offset control signals 182 until the selected output reference voltage 162 reaches a voltage level that cancels the inherent offset of the selected comparator 240. Continuing with the previous example, control circuit 260 cycles through different possible settings for the offset control signals 182. Each setting causes the switching circuit 220 to connect Vref_2 to a different base reference voltage 218. The control circuit 260 continues searching through different settings until the output of comparator 240-2 indicates Vref_2 has reached a voltage level that most closely matches the inherent offset of the comparator 240-2. Control circuit 260 can use any type of search algorithm in adjusting the offset control signals 182. In one embodiment control circuit 260 uses a binary search algorithm or a linear search algorithm.

For example, suppose reference voltage V_5 is 100 mV and comparator 240-2 has an inherent 40 mV offset between its inputs. In this scenario, the result of ADC offset calibration is that output reference voltage Vref_2 is connected to a 60 mV base reference voltage 218. The resulting voltage level for the output reference voltage Vref_2 cancels any inherent offset between the inputs of the comparator 240-2.

In state 296, control circuit 260 saves the setting for the offset control signals 260, such as by storing the setting into registers. The control circuit 260 then returns to state 292 to select another output reference voltage 162 and corresponding comparator 240 for calibration. This process continues until all output reference voltages 162 and comparators 240 are calibrated. Once ADC offset calibration is completed, the buffer 130 is un-tri-stated and all of the switches 202 are opened to enter the normal operational mode.

Gain Calibration

Figure 4:
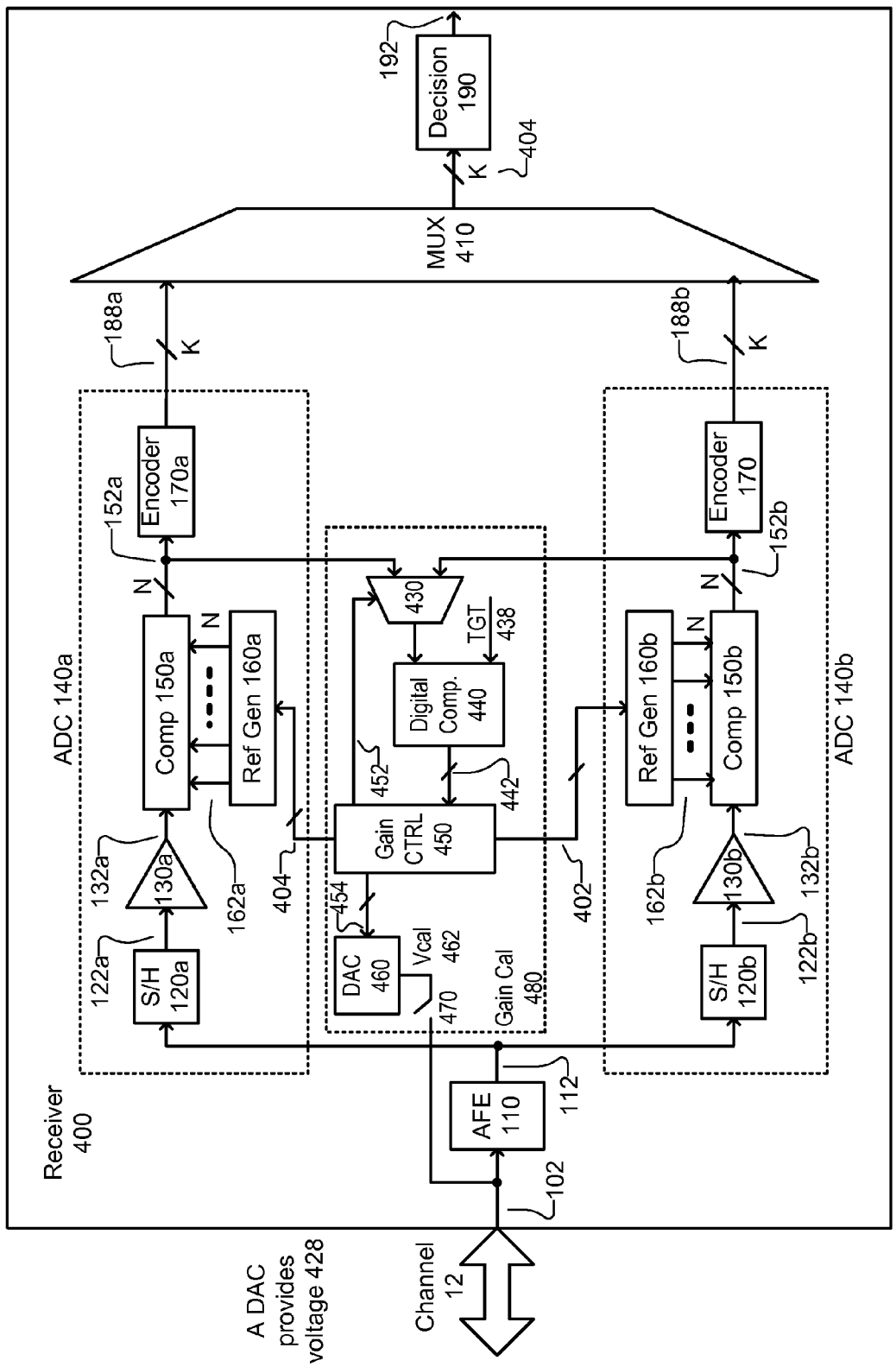
FIG. 4 is a high speed communication system that includes a receiver with multiple analog to digital converters, according to an embodiment.

FIG. 4 is a high speed communication system that includes a receiver 400 with multiple analog to digital converters 140, according to an embodiment. The receiver 400 of FIG. 4 is similar to the receiver 10 of FIG. 1, but now includes two ADCs 140*a* and 140*b* connected in parallel with each other and a gain calibration circuit 480. Only two ADCs 140 are shown in FIG. 4, but in other embodiments there may be more than two ADCs 140 connected in parallel.

During normal operational mode, the ADC's 140 sample the input signal 112 at different times to increase the sampling rate of the receiver 400. For example, at one time, sample and hold circuit 120*a* can sample the input signal 112 to generate sampled input signal 122*a*, which is buffered by buffer 130*a* to generated buffered input signal 132*a*, compared to reference voltages 162*a* by comparator array 150*a* to generate digital thermometer code 152*a*, and encoded into digital input code 188*a* in binary form by encoder 170*a*. At a later time (e.g., 4 ms later), sample and hold circuit 120*b* can sample the input signal 112 to generate sampled input signal 122*b*, which is buffered by buffer 130*b* to generated buffered input signal 132*b*, compared to reference voltages 162*b* by comparator 150*b* to generate digital thermometer code 152*b*, and encoded into digital input code 188*b* in binary form by encoder 170*b*. Multiplexer 410 selects between the digital input codes 188*a* and 188*b* in alternating manner to generate digital input codes 404 for the DSP 192.

Gain calibration circuit 480 forms feedback loops for calibrating the gain of the ADC's 140 based on outputs of comparator arrays 150*a* and 150*b*. Gain calibration circuit 480 includes a multiplexer 430, a digital comparator 440, a controller 450, and a digital to analog converter (DAC) 460. Multiplexer 430 uses ADC selection signal 452 to select one of the thermometer codes 152*a* and 152 as its output. Digital comparator 440 compares the selected thermometer code to a target code 438. The comparator 440 generates a comparator output 442 indicating whether the selected thermometer code is greater than, less than, or equal to the target code 438.

Gain control circuit 450 generates a voltage control code 454 that is provided to the DAC 460. DAC 460 converts the voltage control code 454 into a calibration voltage 462. Gain control circuit 450 also generates gain control signals 402 for adjusting a maximum voltage range of the output reference voltages 162*b*. Adjusting the maximum voltage range of the output reference voltages 162*b* has the effect of altering the gain of the ADC 140*b*. In some embodiments, gain control signal 450 may also generate gain control signals 404 for adjusting a maximum voltage range of the output reference voltages 162*a*.

Ideally, both ADCs 140 should produce identical digital input codes 188 for the same voltage level of the analog input signal 112. However, buffers 130*a* and 130*b* may have slightly different voltages gains due to manufacturing variations. These differences in voltage gain cause ADC 140*a* to produce a slightly different output than ADC 140*b*. For example, if the voltage level of input signal 112 is 5V, both ADCs should ideally generate a digital input code 188 of 111111. However, since the buffers 130*a* and 130*b* are not ideal, ADC 140*a* may generate a digital input code 188*a* of "111111" while ADC 140*b* may generate a slightly different digital input code 188*b* of "011111".

To cancel the gain differences between buffers 130*a* and 130*b*, the gain calibration circuit 480 calibrates one ADC 140 at a time. During calibration switch 470 is closed such that calibration voltage 462 is provided to the input of the AFE 110 instead of the channel signal 102. Gain of the ADC's is then calibrated according to the following process.

First, ADC 140*a* is calibrated. Gain control circuit 450 sets voltage control code 454 to a default starting value. DAC 460 converts the voltage control code 454 to a constant calibration voltage 462. Calibration voltage 462 may initially be set to a voltage level that is substantially half to two/thirds of an expected maximum voltage level to be reached by channel signal 102 during normal operation. Calibration voltage 462 is provided to the input of the AFE 110 to generate the input signal 112. ADC 140*a* then converts the input signal 112 into a thermometer code 152*a*.

Gain control circuit 450 generates selection signal 452 to cause MUX 430 to select thermometer code 152*a* as its output. Digital comparator 440 compares thermometer code 152*a* to a target code 438. The target code 438 is a predetermined multi-bit value that the receiver 400 expects the calibration voltage 462 to be converted into.

Gain control circuit 450 monitors the comparator output 442 to determine if the thermometer code 152*a* is greater than, less than, or equal to the target code 438. If thermometer code 152*a* is greater than target code 438, this indicates the calibration voltage 462 is too high. Therefore the controller 450 decreases the voltage control code 454 to decrease calibration voltage 462. If thermometer code 152*a* is less than target code 438, this indicates the calibration voltage 462 is too low. Therefore the controller 450 increases the voltage control code 454 to increases calibration voltage 462. The adjustment of the calibration voltage 462 continues until thermometer code 152*a* matches the target code 438.

Second, ADC 140*b* is calibrated. Control code 454 is maintained constant 454 at the final value produced during calibration of the first ADC 140*a*. ADC 140*a* converts the resulting analog input signal 112 into a thermometer code 152*a*. Gain control circuit 450 generates selection signal 452 to cause MUX 430 to select thermometer code 152*b* as its output. Digital comparator 440 then compares thermometer code 152*b* to the target code 438.

Gain control circuit 450 monitors the comparator output 442 to determine if the thermometer code 152*b* is greater than, less than, or equal to the target code 438. If thermometer code 152*b* is greater than target code 438, this indicates the gain of ADC 140*b* is too high. Therefore the controller 450 increases the setting for the gain control signals 402, which increases the voltage range of the reference voltages 162*b* and in turn decreases the gain of the ADC 140*b*. If thermometer code 152*b* is less than target code 438, this indicates the gain of ADC 140*b* is too low. Therefore the controller 450 decreases the setting for the gain control signals 402, which decreases the voltage range of the reference voltages 162*b* and in turn increases the gain of the ADC 140*b*.

The adjustment of the reference voltages 162*b* continues until thermometer code 152*b* matches the target code 438. Once the thermometer code 152*b* matches the target code 438, calibration of the ADC 140*b* is completed because the outputs of both ADC's 140*a* and 140*b* now match the same target code 438.

If there are additional ADCs 140, the other ADCs 140 are calibrated in the same manner as ADC 140*b*. In other embodiments, ADC gain calibration circuit 480 can use digital input codes 188 instead of digital thermometer codes 152 as feedback during gain calibration.

Figure 5:
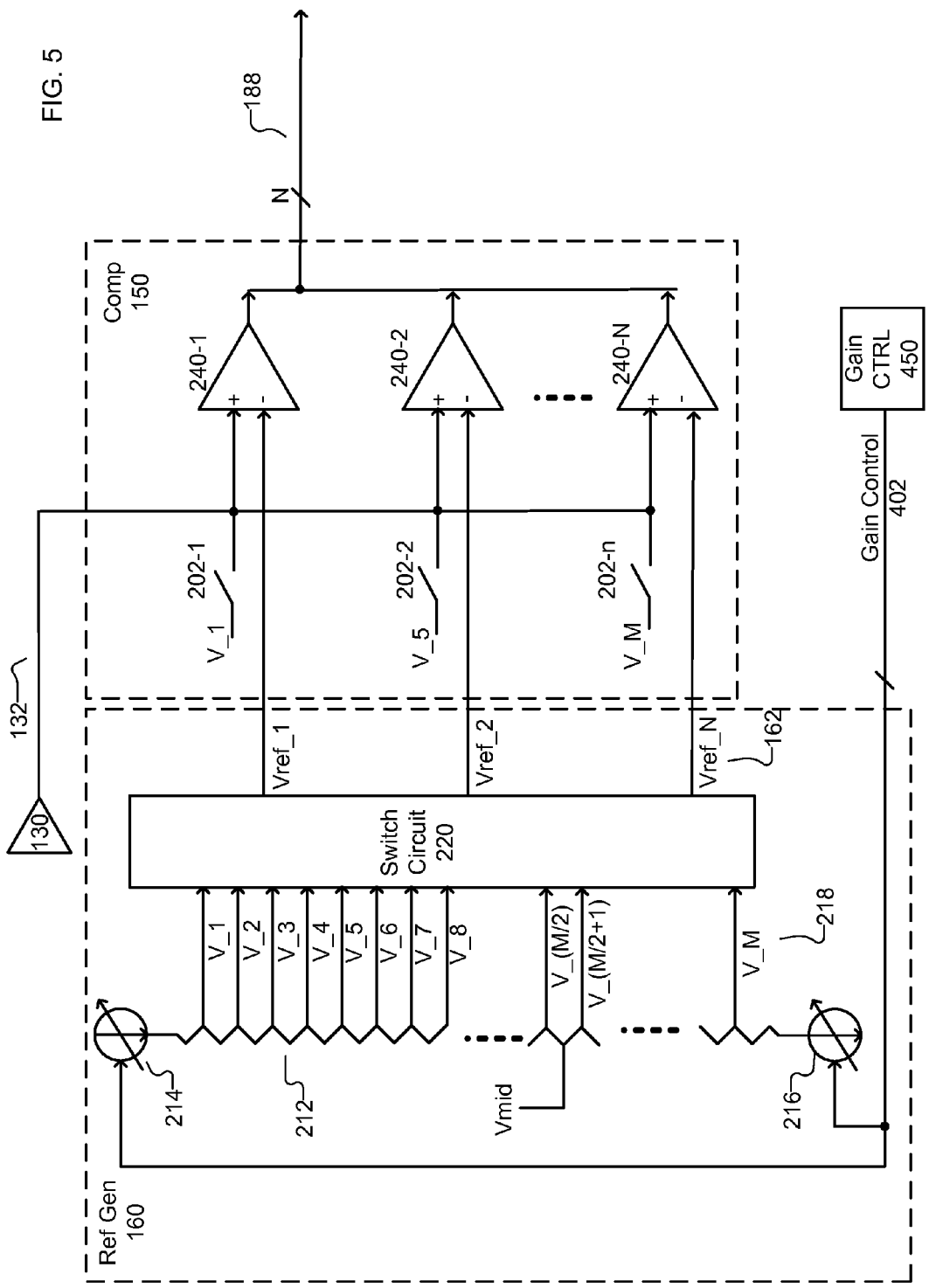
FIG. 5 is a detailed view of a comparator array, reference generator and ADC gain calibration circuit from FIG. 4, according to another embodiment.

FIG. 5 is a detailed view of a comparator array 150 and reference generator 160 from FIG. 4, according to another embodiment. In one embodiment, reference generator 160 represents reference generator 160*b* from FIG. 4, but in other embodiments it can also represent reference generator 160*a*.

Reference generator 160 includes an adjustable current source 214 and an adjustable current sink 216. Adjustable current source 214 controls the amount of current provided to resistor string 212 according to the gain control signals 402. Adjustable current sink 216 controls the amount of current it sinks from resistor string 212 according to the gain control signals. Increasing the current results in a larger voltage range for the base reference voltages 218 due to a larger voltage differential between the highest voltage base reference V_1 and the lowest voltage base reference V_M. This in turn results in a larger voltage range for the output reference voltages 162 due to a larger voltage differential between the highest voltage output reference Vref_1 and the lowest voltage output reference Vref_N. In other words, by controlling current through the resistor string 212, the reference generator 160 adjusts the voltage range of the output reference voltages 162 and therefore the gain of the ADC 140.

Gain and Offset Calibration

Figure 6:
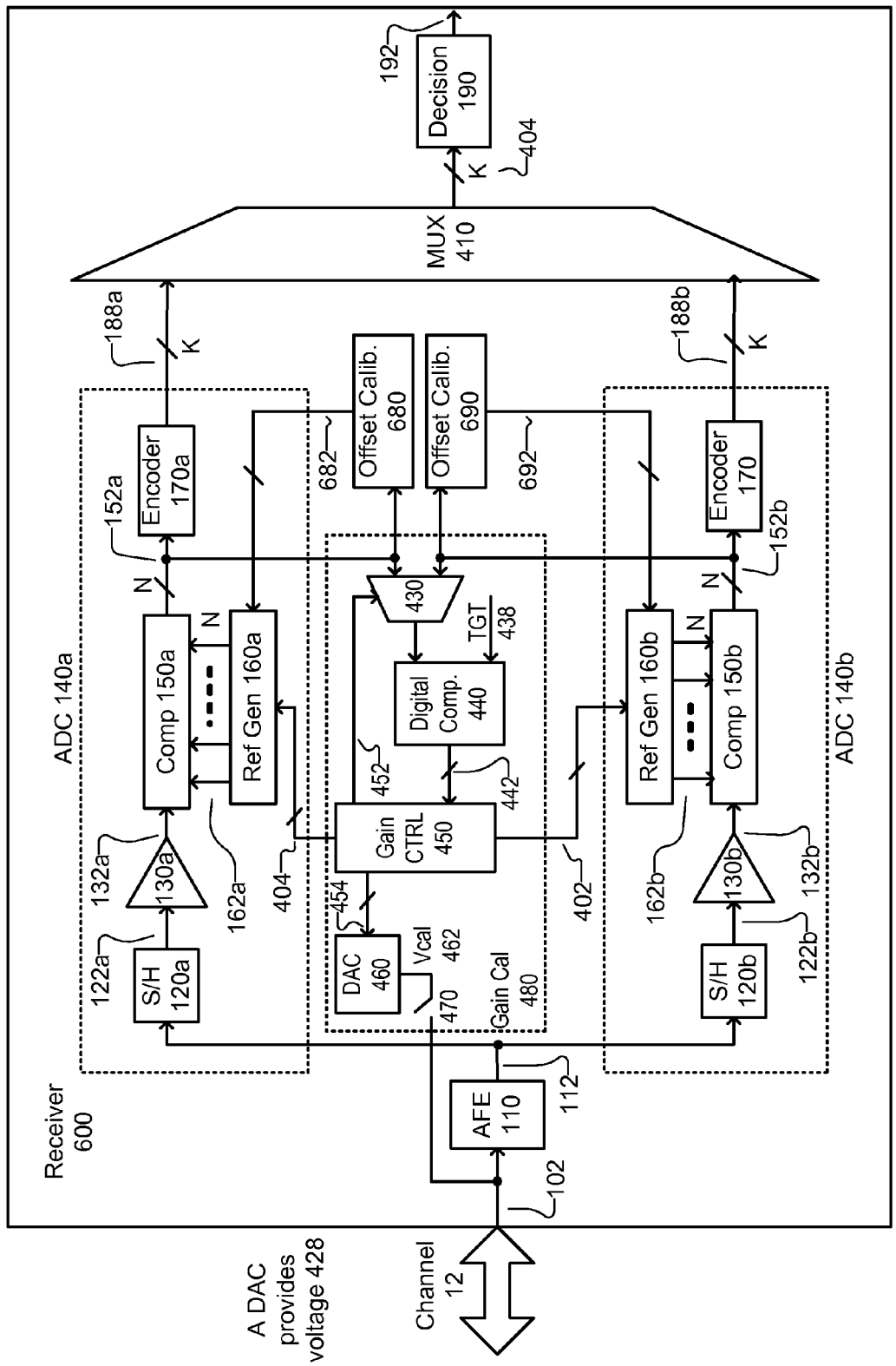
FIG. 6 is a high speed communication system that includes a receiver with multiple analog to digital converters, according to another embodiment.

FIG. 6 is a high speed communication system that includes a receiver 600 with multiple analog to digital converters 140, according to another embodiment. FIG. 6 is similar to FIG. 4, but now includes ADC offset calibration circuits 680 and 682. ADC offset calibration circuit 680 generates offset control signals 682 for adjusting an offset of reference voltages 162*a*. ADC offset calibration circuit 690 generates offset control signals 692 for adjusting an offset of reference voltages 162*b*. In one embodiment, the operation of offset calibration circuits 680 and 690 is similar to offset calibration circuit 180 from FIG. 1 and FIG. 2.

In one embodiment, the offset calibration circuits 680 and 690 perform offset calibration first, and then gain calibration circuit 480 performs gain calibration after offset calibration. However, because gain calibration of ADC 140*b* alters the output reference voltages 162*b*, the output reference voltages 162*b* may no longer have voltage levels that cancel the inherent offset of the comparators 150*b*. To compensate for the effects of gain calibration on offset calibration, offset calibration circuit 690 can perform an offset correction after gain calibration.

Figure 7:
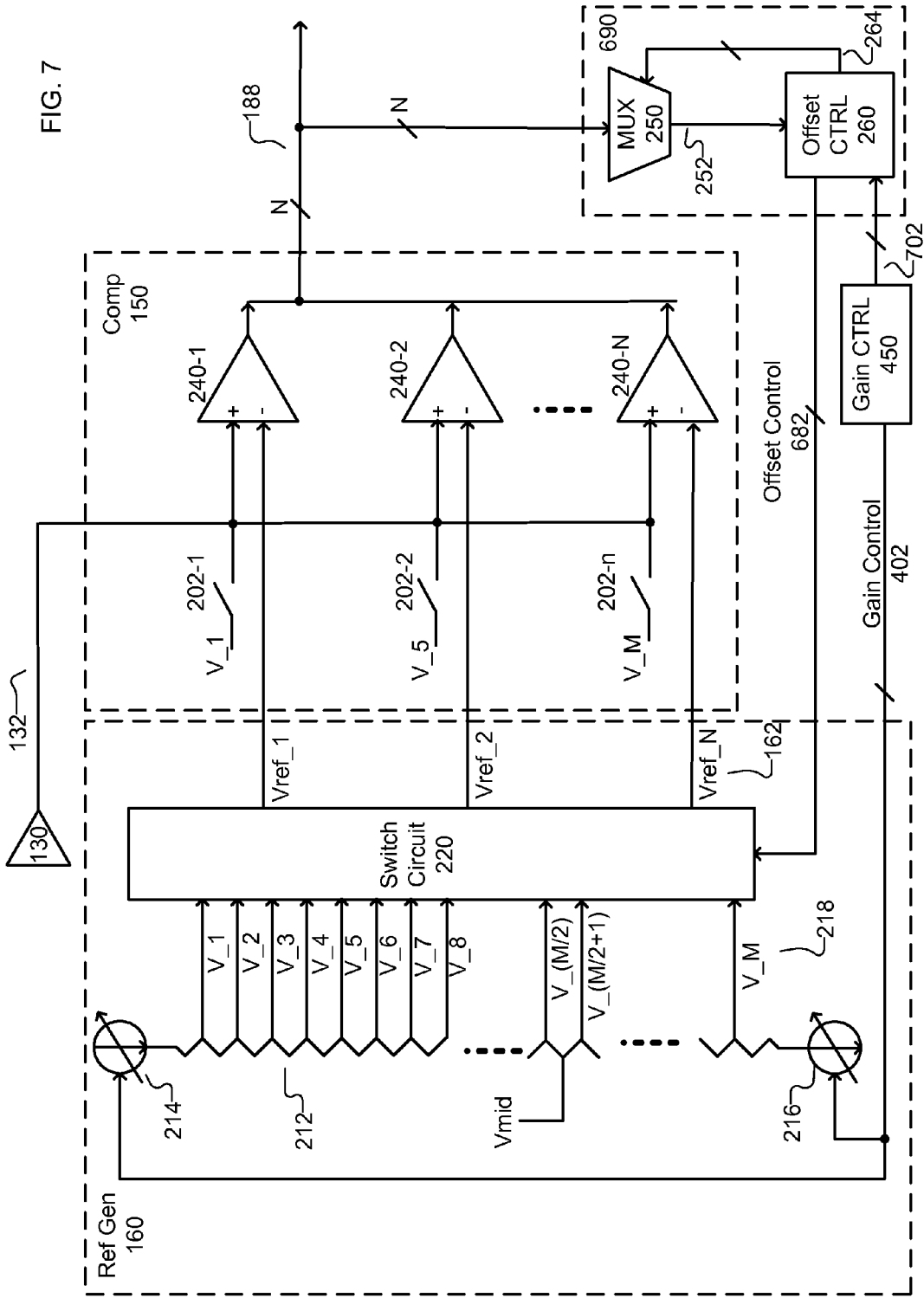
FIG. 7 is a detailed view of a comparator array, reference generator, gain control circuit and offset calibration circuit from FIG. 6, according to another embodiment.

FIG. 7 is a detailed view of a comparator array 150, reference generator 160, gain control circuit 450 and offset calibration circuit 690 from FIG. 6, according to another embodiment. Gain control circuit 450 now outputs a change parameter 702 specifying how much the setting for the gain control signals 402 changed during the prior gain calibration. For a given output reference voltage 162, offset control circuit 260 then calculates a new setting for the offset control signals 182 of the output reference voltage 162 using the following equation:

$$CORRECTOFF = \text{Round}\left(\frac{CALIBOFF}{1 + \frac{\Delta GAIN}{TOTGAINSETTINGS}}\right) \quad \text{(equation 1)}$$

CALIBOFF is the difference in base reference voltage steps between the ideal reference voltage (e.g., V_5 at positive input to comparator 240-2) and the calibrated reference voltage (e.g. Vref_2 at negative input to comparator 240-2). CALIBOFF is known as a result of the previous offset calibration. For example, if Vref_2 was connected to V_8 during offset calibration, CALIBOFF is equal to "3", which is the number of base reference voltage steps between V_8 and V_5.

ΔGAIN is the amount of change in the setting for the gain control signals 402 that occurred during gain calibration (e.g., change of 4 gain setting steps). ΔGAIN is reflected in the parameter 602 received from the gain control circuit 450. TOTGAINSETTINGS is the number of total possible settings for the gain control signals 402 and is a pre-determined number (e.g., 64 possible settings).

CORRECTOFF is the corrected difference in base reference voltage steps between the ideal reference voltage (e.g., V_5 at positive input to comparator 240-2) and the calibrated reference voltage (e.g. Vref_2 at negative input to comparator 240-2). For example, a CORRECTOFF of "2" indicates that Vref_2 should be connected to V_7, which is two base reference voltage steps from the ideal reference of V_5. The CORRECTOFF value is then used to adjust the base reference voltage 218 that the output reference voltage 162 is connected to.

This calculation is performed one by one for each comparator 240 and associated output reference voltage 162. In one embodiment, the values for CORRECTOFF can be computed in real time. In another embodiment, the values for CORRECTOFF can be determined from a look-up table that reference values for CALIBOFF and ΔGAIN to pre-computed values for CORRECTOFF.

Figure 8:
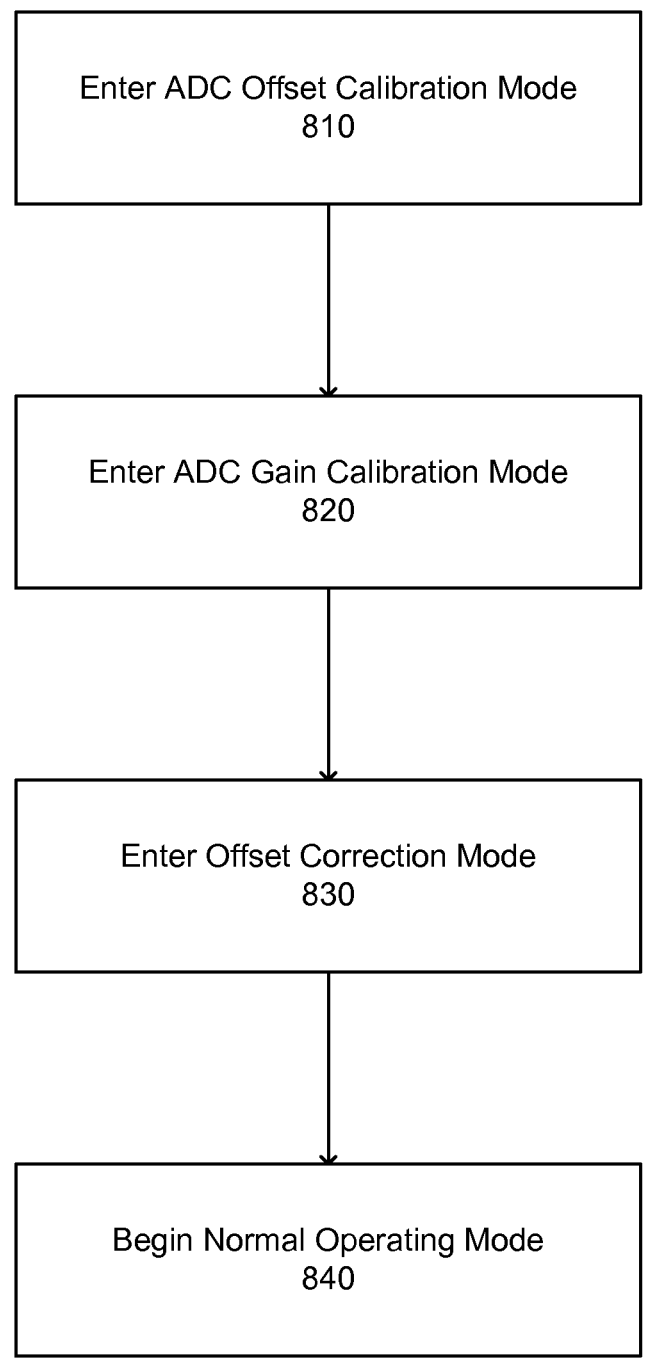
FIG. 8 is a flowchart for a method of operation in the receiver from FIG. 6, according to an embodiment.

FIG. 8 is a flowchart for a method of operation in the receiver 600 from FIG. 6, according to an embodiment. In step 810, the receiver 600 enters an ADC offset calibration mode. During this mode, ADC offset calibration circuits 680 and 690 generate offset control signals 682 and 692 for adjusting the output reference voltages 162a and 162b. The offset control signals 682 and 692 are generated based on outputs of the comparator arrays 150a and 150b. ADC offset calibration circuits 680 and 690b cause the output reference voltages 162a and 162b to be adjusted until they reach voltage levels that cancel unwanted voltage offsets within the comparator arrays 150a and 150b.

In step 820, the receiver 600 enters an ADC gain calibration mode. During this mode, ADC gain calibration circuit 480 adjusts the calibration voltage 462 based on outputs of the comparator array 150a. Calibration voltage 462 is adjusted until thermometer code 152a matches target code 438. ADC gain calibration circuit 480 also adjusts the gain control signals 402 based on outputs of the comparator array 150a. ADC gain calibration circuit 480 causes a voltage range of the output reference voltages 162b to be adjusted until thermometer code 152b matches the target code 438.

In step 830, the receiver 600 enters offset correction mode. During offset correction mode, the offset calibration circuit 690 corrects for changes to the offset calibration introduced during ADC gain calibration mode. In some embodiments modes 810-830 may be repeated one or more times.

In step 840, after calibration is completed, the receiver 600 enters normal operation mode. During normal operating mode the settings for the gain control signals 402 and the offset control signals 682 and 692 are fixed to their calibrated settings and are not altered. The ADCs 140a and 140b are utilized in round-robin manner to convert the analog input signal 112 into digital input codes 404. The decision circuit 190 receives the digital input codes 404 and makes a decision on the data represented by the digital input codes 404 in order to recover digital data 192.

In another embodiment, instead of waiting for gain calibration 820 to complete, offset correction 830 occurs each time gain calibration 820 changes the gain setting by one step. This prevents the output reference voltages 162b from drifting too far away from their calibrated voltage levels during gain calibration.

In one embodiment, a representation of the receiver 10, 400, 600 or circuits within the receiver 10, 400, 600 may be stored as data in a non-transitory computer-readable medium (e.g. hard disk drive, flash drive, optical drive). These representations may be behavioral level, register transfer level, circuit component level, transistor level and layout geometry-level descriptions.

Upon reading this disclosure, those of ordinary skill in the art will appreciate still additional alternative structural and functional designs for a receiver having an ADC with adjustable reference voltages through the disclosed principles of the present disclosure. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure disclosed herein without departing from the spirit and scope of the disclosure as defined in the appended claims.

What is claimed is:

1. A receiver comprising:
   a first analog to digital converter comprising:
      a first reference generator to generate a first set of N reference voltages from a first set of M reference voltages where M is greater than N, the first reference generator adjusting voltage levels of the first set of N reference voltages based on one or more first control signals, the first reference generator comprising a plurality of switches coupled between voltage lines for the first set of M reference voltages and voltage lines for the first set of N reference voltages, the switches to selectively connect a subset of the voltage lines for the first set of M reference voltages to the voltage lines for the first set of N reference voltages based on the one or more first control signals; and
      a first plurality of comparators to compare a first input signal to the first set of N reference voltages; and
   calibration circuitry to generate the one or more first control signals for adjusting the voltage levels of the first N reference voltages based on outputs of the first plurality of comparators.

2. The receiver of claim 1, wherein the first reference generator comprises:
   a resistor string to generate the set of M reference voltages at a plurality of taps of the resistor string; and
   a current regulation circuit coupled to the resistor string and regulating current through the resistor string, the current regulation circuit adjusting the current through the resistor string based on the first control signals.

3. The receiver of claim 2, wherein the current regulation circuit comprises at least one of an adjustable current source sourcing the current to the resistor string or an adjustable current sink sinking the current from the resistor string.

4. The receiver of claim 2, wherein the calibration circuitry further generates the control signals based on a parameter indicative of an amount of prior change in a setting for the current.

5. A receiver comprising:
   a first analog to digital converter comprising:
      a first reference generator to generate a first set of N reference voltages, the first reference generator adjusting voltage levels of the first set of N reference voltages based on one or more first control signals; and
      a first plurality of comparators to compare a first input signal to the first set of N reference voltages; and
   calibration circuitry to generate the one or more first control signals for adjusting the voltage levels of the first N reference voltages based on outputs of the first plurality of comparators, the calibration circuitry comprising:

a multiplexer to generate a multiplexer output by selecting a single output at a time from the outputs of the first plurality of comparators; and circuitry to generate the one or more first control signals for adjusting the voltage levels of the first N reference voltages based on the multiplexer output.

6. The receiver of claim 5, wherein the circuitry to generate the first control signals generates the first control signals based on the multiplexer output using a binary search algorithm.

7. A receiver comprising:
a first analog to digital converter comprising:
a first reference generator to generate a first set of N reference voltages, the first reference generator adjusting voltage levels of the first set of N reference voltages based on one or more first control signals; and
a first plurality of comparators to compare a first input signal to the first set of N reference voltages; and
calibration circuitry to generate the one or more first control signals for adjusting the voltage levels of the first N reference voltages based on outputs of the first plurality of comparators, the calibration circuitry comprising:
a first digital comparator to compare a digital code generated from the outputs of the first plurality of comparators to a target code; and
circuitry to generate the one or more first control signals for adjusting the voltage levels of the first N reference voltages based on an output of the first digital comparator.

8. A receiver comprising:
a first analog to digital converter comprising:
a first reference generator to generate a first set of N reference voltages, the first reference generator adjusting voltage levels of the first set of N reference voltages based on one or more first control signals; and
a first plurality of comparators to compare a first input signal to the first set of N reference voltages;
a second analog to digital converter comprising:
a second reference generator to generate a second set of N reference voltages, the second reference generator adjusting voltage levels of the second set of N reference voltages based on one or more second control signals; and
a second plurality of comparators to compare a second input signal to the second set of N reference voltages,
calibration circuitry to generate the one or more first control signals for adjusting the voltage levels of the first N reference voltages based on outputs of the first plurality of comparators, and to generate the one or more second control signals for adjusting the voltage levels of the second set of N reference voltages based on outputs of the second plurality of comparators.

9. The receiver of claim 8, wherein the first analog to digital converter comprises a first buffer to generate the first input signal based on an analog input signal and the second analog to digital converter comprises a second buffer to generate the second input signal based on the analog input signal, the first buffer having different gain than the second buffer.

10. The receiver of claim 9, wherein the calibration circuitry generates the first control signals based on a comparison between a target code and a first digital code generated from the outputs of the first plurality of comparators, and wherein the calibration circuitry further generates the second control signals based on a comparison between the target code and a second digital code generated from the outputs of the second plurality of comparators.

11. The receiver of claim 9, further comprising:
a digital to analog converter to generate a calibration voltage, wherein the analog input signal is generated based on the calibration voltage.

12. A non-transitory computer readable medium storing a representation of a receiver, the receiver comprising:
a first analog to digital converter comprising:
a first reference generator to generate a first set of N reference voltages from a first set of M reference voltages where M is greater than N, the first reference generator adjusting voltage levels of the first set of N reference voltages based on one or more first control signals, the first reference generator comprising a plurality of switches coupled between voltage lines for the first set of M reference voltages and voltage lines for the first set of N reference voltages, the switches to selectively connect a subset of the voltage lines of for the first set of M reference voltages to the voltage lines for the first set of N reference voltages based on the one or more first control signals; and
a first plurality of comparators to compare a first input signal to the first set of N reference voltages; and
calibration circuitry to generate the one or more first control signals for adjusting the voltage levels of the first N reference voltages based on outputs of the first plurality of comparators.

13. The non-transitory computer readable medium of claim 12, wherein the first reference generator comprises:
a resistor string to generate the set of M reference voltages at a plurality of taps of the resistor string; and
a current regulation circuit coupled to the resistor string and regulating current through the resistor string, the current regulation circuit adjusting the current through the resistor string based on the first control signals.

14. A non-transitory computer readable medium storing a representation of a receiver, the receiver comprising:
a first analog to digital converter comprising:
a first reference generator to generate a first set of N reference voltages, the first reference generator adjusting voltage levels of the first set of N reference voltages based on one or more first control signals; and
a first plurality of comparators to compare a first input signal to the first set of N reference voltages;
a second analog to digital converter comprising:
a second reference generator to generate a second set of N reference voltages, the second reference generator adjusting voltage levels of the second set of N reference voltages based on one or more second control signals; and
a second plurality of comparators to compare a second input signal to the second set of N reference voltages,
calibration circuitry to generate the one or more first control signals for adjusting the voltage levels of the first N reference voltages based on outputs of the first plurality of comparators, and to generate the one or more second control signals for adjusting the voltage levels of the second set of N reference voltages based on outputs of the second plurality of comparators.

15. The non-transitory computer readable medium of claim 14, wherein the first analog to digital converter comprises a first buffer to generate the first input signal based on an analog input signal and the second analog to digital converter comprises a second buffer to generate the second input signal based on the analog input signal, the first buffer having different gain than the second buffer.

16. The non-transitory computer readable medium of claim 14, wherein the plurality of switches is configurable to selectively connect any of the voltage lines for the first set of N reference voltages to any of the voltage lines for the second set of M reference voltages.

17. A method of operation in a receiver, the method comprising:
  generating a first set of N reference voltages from a first set of M reference voltages, where M is greater than N;
  generating one or more first control signals for adjusting voltage levels of the N reference voltages based on outputs of a first plurality of comparators of an analog to digital converter;
  adjusting voltage levels of the first set of N reference voltages based on the one or more first control signals, the adjusting comprising selectively connecting, via a plurality of switches coupled between voltage lines for the first set of M reference voltages and voltage lines for the first set of N reference voltages, a subset of the voltage lines for the first set of M reference voltages to the voltage lines for the first set of N reference voltages based on the one or more first control signals; and
  performing analog to digital conversion by comparing a first input signal to the first set of N reference voltages using the first plurality of comparators.

* * * * *